United States Patent [19]

Nakazawa

[11] Patent Number: 5,097,297

[45] Date of Patent: Mar. 17, 1992

[54] THIN FILM TRANSISTOR

[75] Inventor: Takashi Nakazawa, Suwa, Japan

[73] Assignee: Seiko Epson Corporation, Tokyo, Japan

[21] Appl. No.: 671,180

[22] Filed: Mar. 15, 1991

Related U.S. Application Data

[63] Continuation of Ser. No. 324,123, Mar. 16, 1989, abandoned.

[30] Foreign Application Priority Data

Mar. 18, 1988 [JP] Japan .................. 63-64960
Mar. 24, 1988 [JP] Japan .................. 63-69988

[51] Int. Cl.$^5$ .............. H01L 27/22; H01L 27/01; H01L 27/10; H01L 23/48
[52] U.S. Cl. ...................... 357/4; 357/23.7; 357/45; 357/71
[58] Field of Search .......... 357/23.7, 4, 45, 71

[56] References Cited

U.S. PATENT DOCUMENTS

| | | | |
|---|---|---|---|
| 3,385,731 | 5/1968 | Weimer | 357/23.7 |
| 4,582,395 | 4/1986 | Morozumi | 357/23.7 |
| 4,597,001 | 6/1986 | Bortscheller et al. | 357/23.7 |
| 4,770,498 | 9/1988 | Aoki et al. | 357/23.7 |
| 4,804,953 | 2/1989 | Castleberry | 357/23.7 |
| 4,853,755 | 8/1989 | Okabe et al. | 357/4 |
| 4,907,861 | 3/1990 | Muto | 357/4 |

FOREIGN PATENT DOCUMENTS 62-150887 of 1987 Japan .................. 357/23.7
63-151083 of 1988 Japan .................. 357/23.7

OTHER PUBLICATIONS

D. J. Krick, "MNOS memory array fabricated on an insulating substrate", *IBM Technical Disclosure Bulletin*, vol. 15 (Jul. 1972) pp. 466–467.

Morozumi, et al., "Low Temperature Processed Poly Si TFT and Its Application Large Area LCD", *Japan Display '86*, 1986 pp. 196–199.

Ohshima, et al., "9.5 -in. Poly-Si TFT-LCD with New Transistor Configuration", *SID 88 Digest*, May 24, 1988, pp. 408–411.

*Primary Examiner*—J. Carroll
*Attorney, Agent, or Firm*—Blum Kaplan

[57] ABSTRACT

A thin film transistor including at least one elongated source electrode and one elongated drain electrode disposed parallel to each other with a channel region formed by depositing a semiconductor material substantially perpendicular to and across the parallel electrodes, a gate insulating film formed on the channel region and a gate electrode formed on the gate insulating film. In a preferred embodiment, there is a plurality of source electrodes and one fewer drain electrodes with each drain electrode disposed between two source electrodes. Displacement or misalignment of masks during formation do not result in a change in parasitic capacitance.

32 Claims, 13 Drawing Sheets

THIN FILM TRANSISTOR

This is a continuation of application Ser. No. 324,123, filed Mar. 16, 1989, now abandoned.

BACKGROUND OF THE INVENTION

The invention relates generally to a thin film transistor and more particularly to a thin film transistor in which the parasitic capacitance does not vary with the relative positioning of the thin film transistor elements. Thin film transistors (TFT's) formed in accordance with the invention are advantageously included in active matrix liquid crystal displays, image sensors and three dimensional integrated circuits which require uniform TFT characteristics.

A conventional thin film transistor 230 having the structure discussed in Japan Display '86, 1986, pp. 196-199 is show generally in FIGS. 3 and 4. A source electrode 202 and a drain electrode 203 are formed on an insulating substrate 201, made of glass, quartz or sapphire. Source 202 and drain 203 are formed of polycrystal silicon thin films that include impurities, such as donors or acceptors. A source line 204 and a drain line 205 are disposed on substrate 201 in contact with source electrode 202 and drain electrode 203, respectively. A channel region 206, formed of a thin film of polycrystal silicon, is disposed thereon to contact both source 202 and drain 203. A gate insulating film 207 covers these elements and a gate electrode 208 is disposed thereon, patterned to oppose channel 206 with insulating film 207 therebetween.

Conventional thin film transistors formed as in FIGS. 3 and 4 have disadvantages as illustrated in the plan views in FIGS. 5A, 5B and 5C and in the equivalent circuit of the FIG. 6. A TFT 350a, 350b and 350c shown in FIGS. 5A, 5B and 5C respectively, include a source 301 and a drain 302 formed on an insulating substrate and a channel 303 therebetween. These elements are covered with a gate insulating film 307. A gate electrode 304 is patterned on gate insulating film 307 and overlaps portions of source 301, channel 303 and drain 302. Parasitic capacitance 40 is generated by the portion of gate electrode 304 overlapping source 301 and channel 303 corresponding to similarly cross-hatched region $S_1$. Parasitic capacitance 402 is generated by a portion of gate electrode 304 opposing a portion of channel 303 and drain 302 corresponding to similarly cross-hatched region $S_2$.

If the pattern of gate electrode 304 is unintentionally displaced in the direction of an arrow 305, parasitic capacitance 401($S_1$) is decreased and parasitic capacitance 402($S_2$) is increased. Conversely, if the pattern of gate electrode 304 is unintentionally displaced in the direction of an arrow 306, parasitic capacitance 401($S_1$) is increased and parasitic capacitance 402($S_2$) is decreased. Accordingly, the parasitic capacitance of the thin film transistor varies widely with pattern slippage of gate electrode 304 towards either source 301 or drain 302.

Major factors contributing to such pattern slippage are alignment slippage of gate electrode 304 and pitch slippage between photo masks. Consequently, the parasitic capacitance can unintentionally vary within the same substrate or between different substrates making it difficult to maintain the circuit at a constant predetermined level.

If the thin film transistor is included within a liquid crystal display, individual display element properties will likewise vary which adversely affects picture quality. Occurrences or pattern slippage increase with the size of liquid crystal displays so that there is substantial display quality deterioration in large LCD's. Picture element variation caused by pattern slippage has been a major obstacle to forming large LCD's.

These variations in capacitance also cause problems when conventional TFT's are included in image sensors and three dimensional integrated circuits because it is difficult to maintain the circuits at constant predetermined levels, a major obstacle for practical use.

Accordingly, it is desirable to develop an improved TFT which does not have shortcomings associated with variations in parasitic capacitance occurring in conventional TFT's.

SUMMARY OF THE INVENTION

Generally speaking, in accordance with the invention, a thin film transistor (TFT) which maintains a constant parasitic capacitance despite pattern slippage is provided. The TFT includes at least one elongated source electrode and one elongated drain electrode oriented in parallel and spaced apart from the source electrode with an elongated gate disposed across the source and drain electrodes. The source electrodes and the drain electrodes are wired in parallel and a semiconductor channel layer is provided to contact all of the source and drain electrodes.

In a preferred embodiment of the invention the TFT includes at least two source electrodes and one fewer drain electrode, disposed between the source electrodes. Alternatively, an equal number of parallel source and drain electrodes can be employed in a staggered pattern. The source electrodes, semiconductor channel and drain electrodes are covered with a gate insulating film and a gate electrode is provided on the insulating film to overlap the semiconductor channel completely so that common displacements of the pattern of elements does not affect parasitic capacitance.

Accordingly, it is an object of the invention to provide an improved TFT.

Another object of the invention is to provide an improved TFT in which parasitic capacitance does not vary with pattern slippage.

A further object of the invention is to provide a TFT which is advantageously included on large substrates and in large active matrix electro-optical devices.

Still another object of the invention is to provide an improved TFT which need not be formed by the ion implantation method or other complex expensive methods.

Still other objects and advantages of the invention will in part by obvious and will in part be apparent from the specification and drawings.

The invention accordingly comprises the several steps and the relation of one or more of such steps with respect to each of the others, and the article possessing the features, properties and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

A thin film transistor formed in accordance with the invention includes a plurality of source electrodes with a drain electrode positioned parallel with and between the source electrodes. The source electrodes and drain electrodes are wired in parallel and a layer of semiconductor material is disposed on the source electrodes and drain electrodes to act as a channel element by contacting the source and drain regions of each of the electrodes. The semiconductive channel element is covered with a layer of insulating material and a gate electrode is patterned on the insulating layer to oppose portions of each source electrode and each drain electrode and the entire channel element.

The following examples are set forth to describe TFT's constructed in accordance with the invention more clearly. They are intended to be illustrative and are not presented in a limiting sense.

EXAMPLE 1

Figure 1:
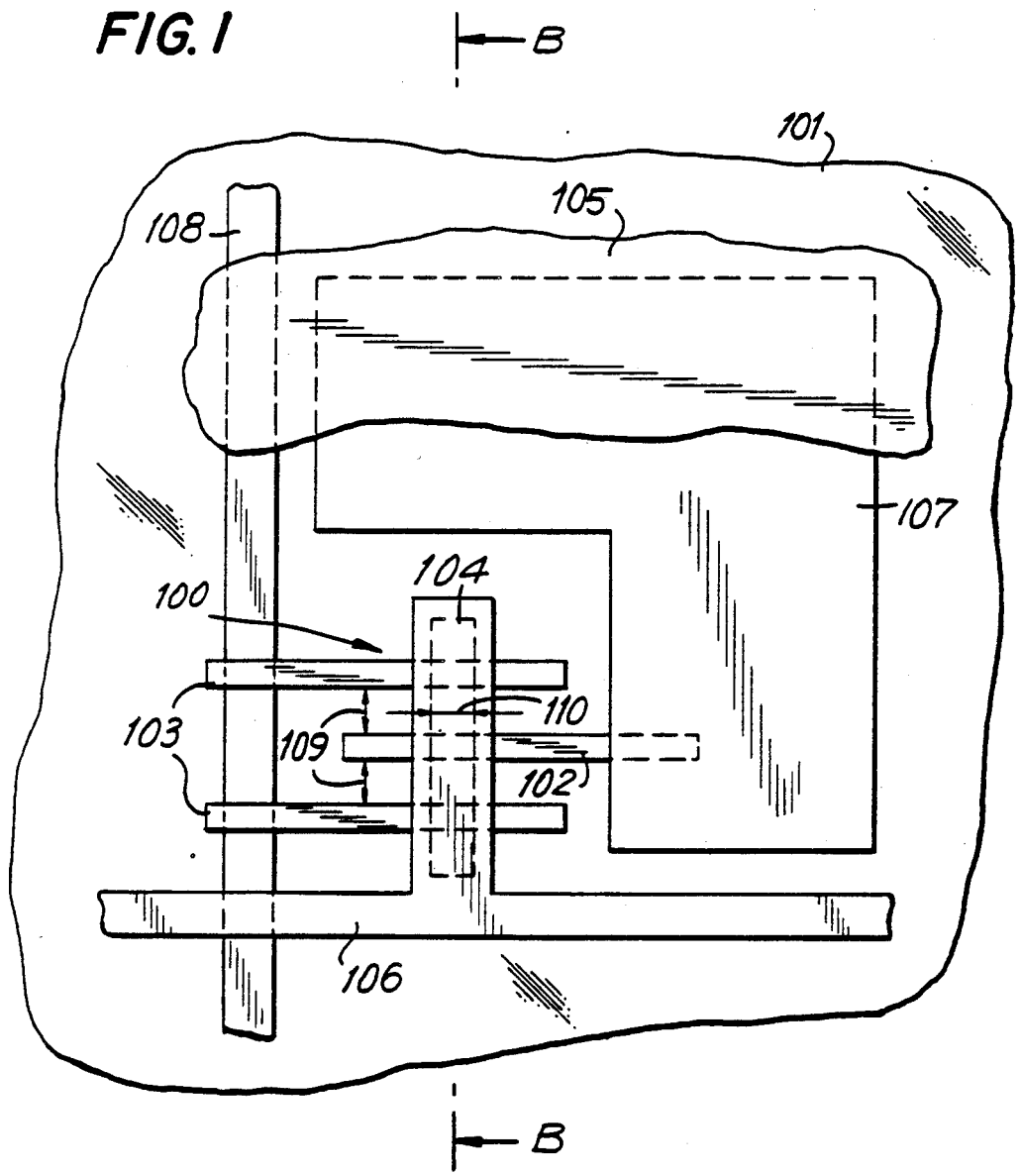
FIG. 1 is a top plan view of a picture element of an active matrix including a thin film transistor formed in accordance with the invention.
Figure 2:
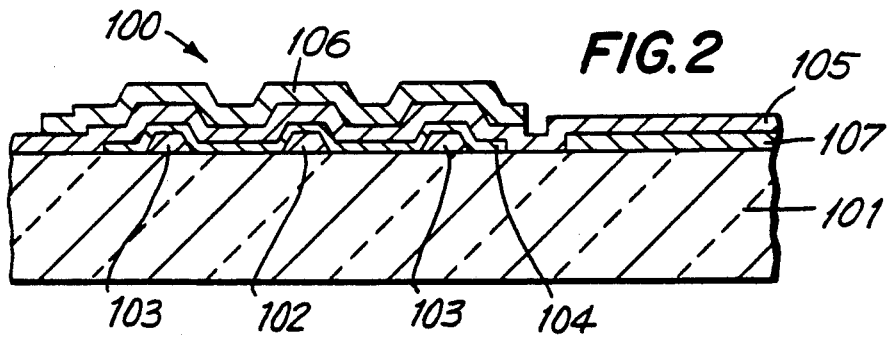
FIG. 2 is a cross-sectional view taken along line B—B of the thin film transistor shown in FIG. 1.
Figure 3:
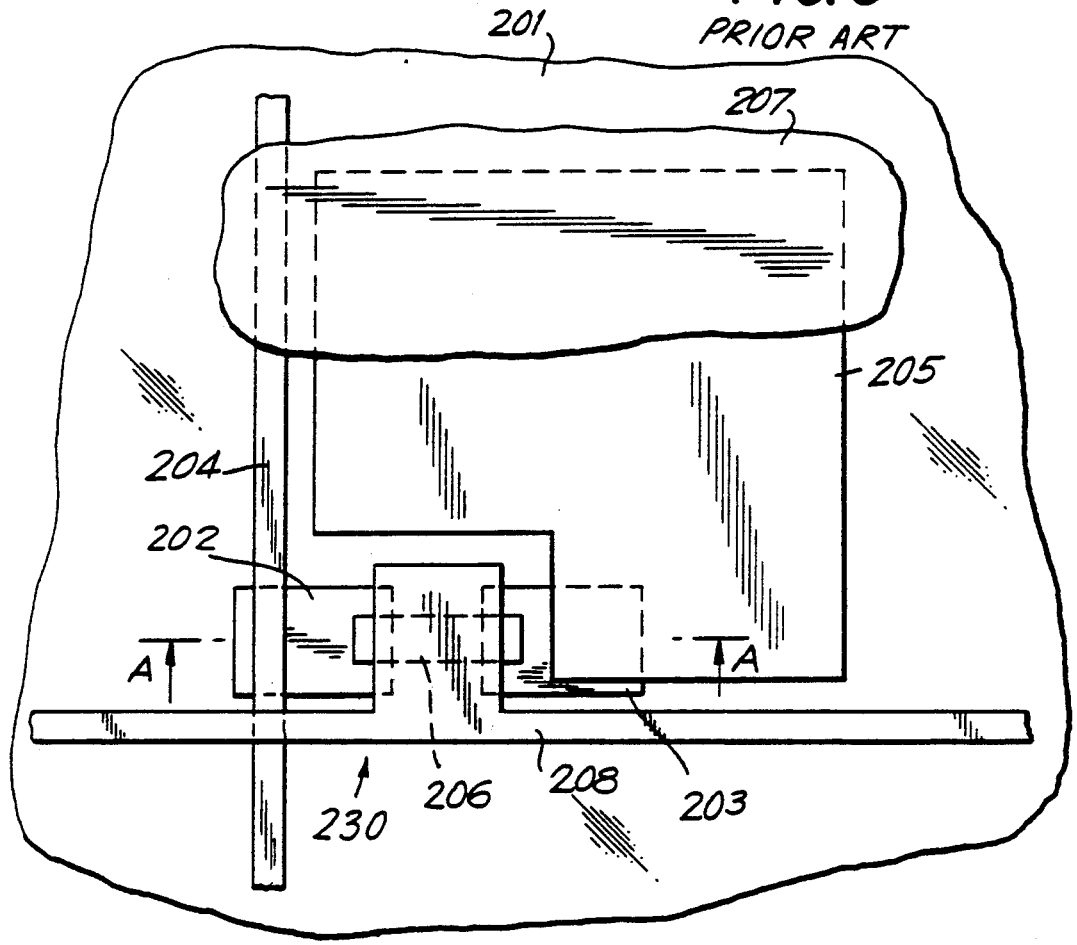
FIG. 3 is a top plan view of a picture element of an active matrix including a conventional thin film transistor.
Figure 4:
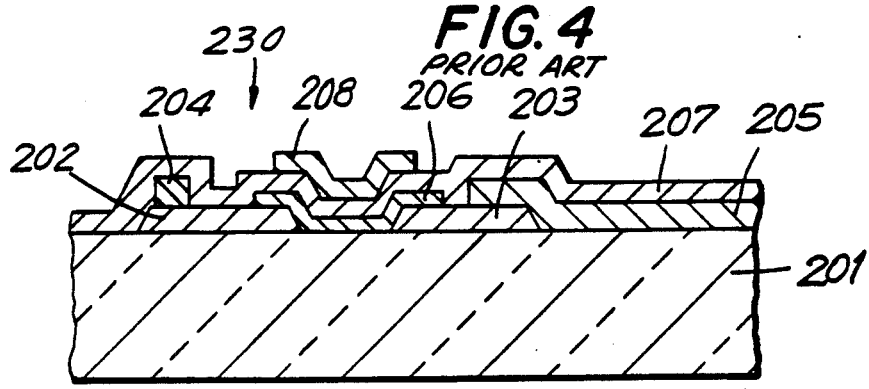
FIG. 4 is a cross-sectional view taken along A—A of the thin film transistor shown in FIG. 3.
Figure 5A:
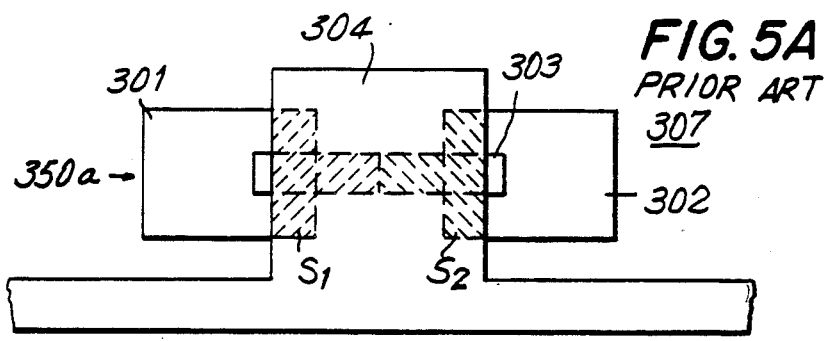
FIGS. 5A, 5B and 5C are top plan views of a conventional thin film transistor of the type shown in FIGS. 3 and 4.
Figure 5B:
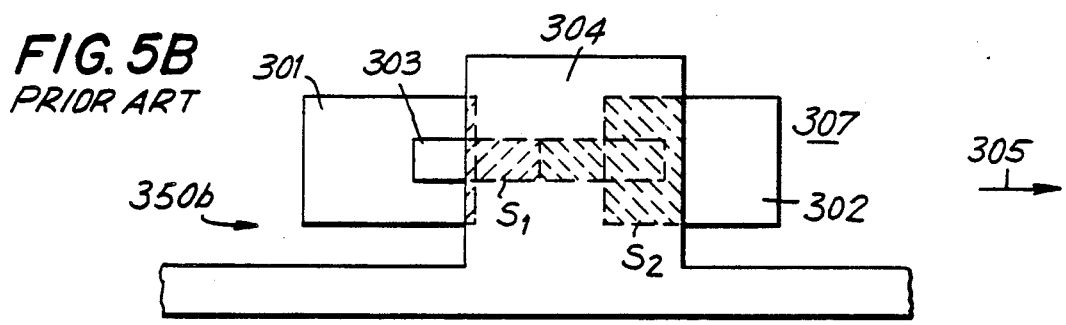
Figure 5C:
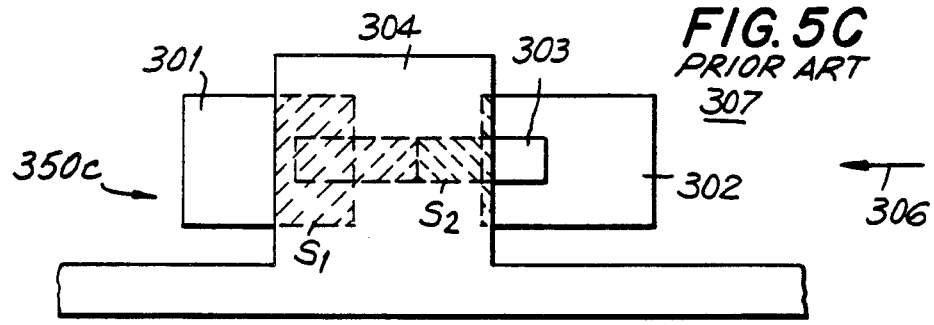
Figure 6:
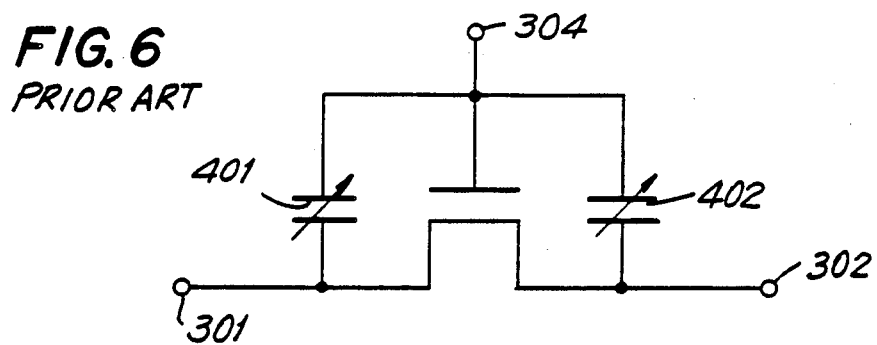
FIG. 6 is the equivalent circuit of the type of thin film transistor shown in FIGS. 5A, 5B and 5C.
Figure 7A:
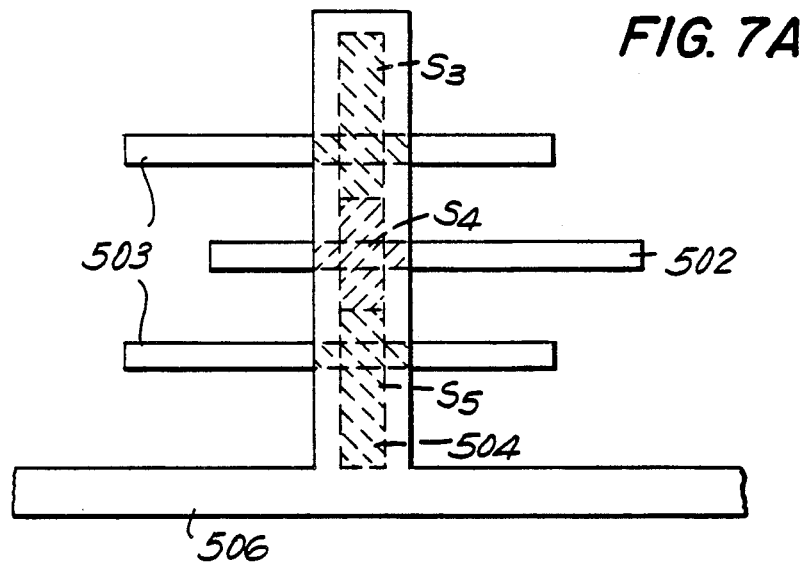
FIGS. 7A, 7B, 7C, 7D and 7E are top plan views of the type of thin film transistor formed in accordance with the invention.
Figure 7B:
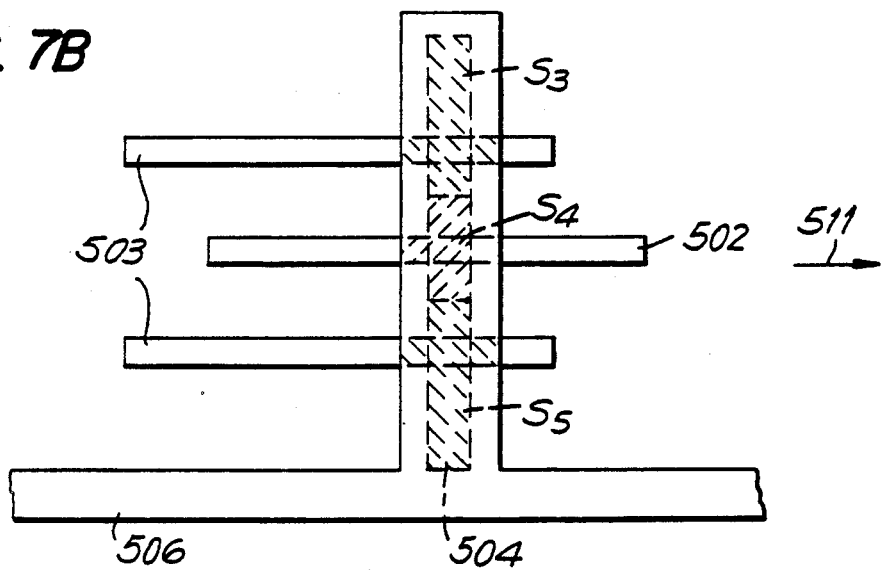
Figure 7C:
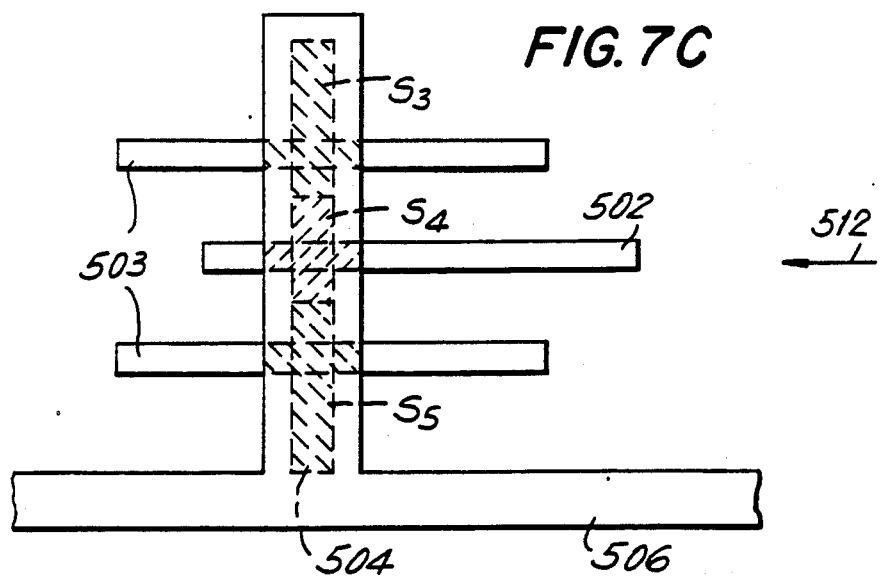
Figure 7D:
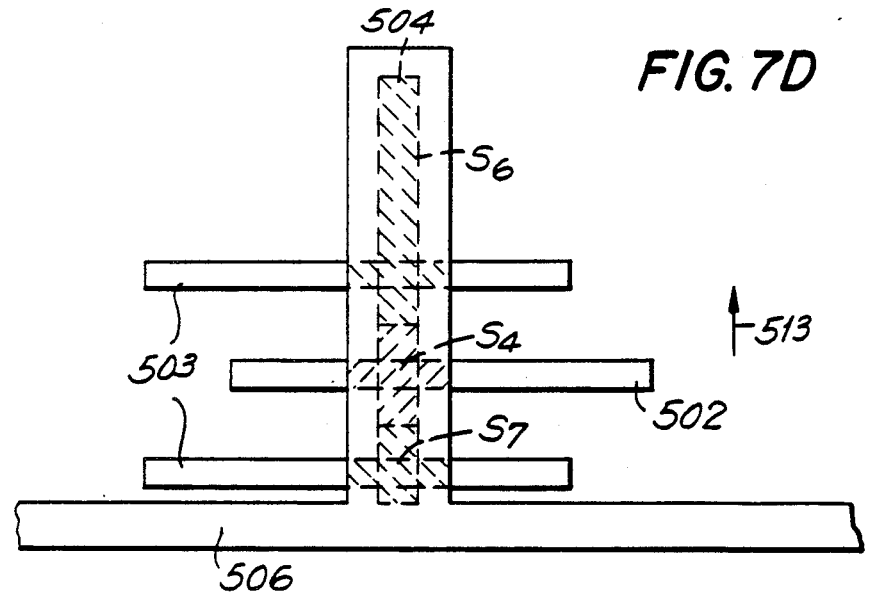
Figure 7E:
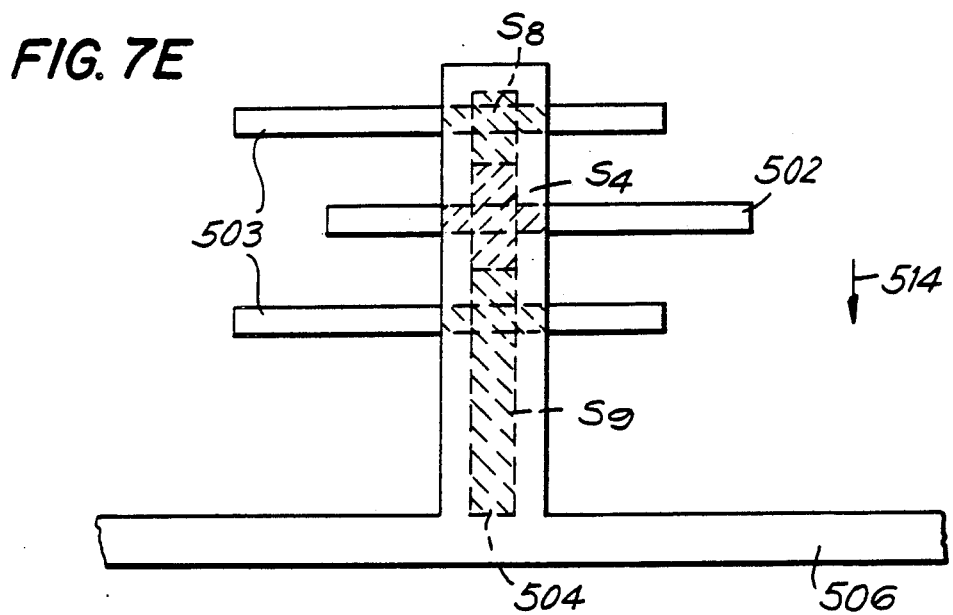
Figure 8:
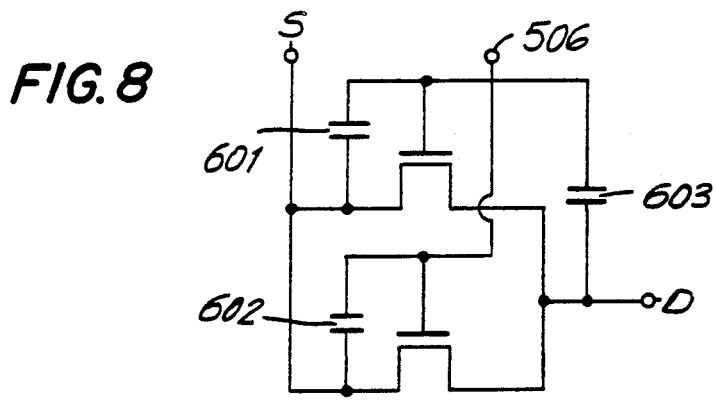
FIG. 8 is the equivalent circuit of the type of thin film transistor shown in FIGS. 7A, 7B, 7C, 7D and 7E.

A thin film transistor 100 constructed in accordance with this first embodiment of the invention is illustrated in the top plan view of FIG. 1 and in the cross-section view of FIG. 2. A pair of source electrodes 103 are arranged in parallel on a substrate 101. A drain electrode 102 is disposed between and parallel to source electrodes 103. A source line 108 is disposed on substrate 101, electrically coupled with source electrodes 103 in parallel and a drain line 107 is disposed on substrate 101, electrically coupled with drain electrode 102. Source electrodes 103 are thin silicon films, such as polycrystalline silicon or amorphous silicon which has been doped with donor or acceptor impurities. Substrate 101 is formed of glass, quartz, sapphire or the like. Source line 108, source electrode 103 and drain electrode 102 should be less than about 20 $\mu$m wide, between about 500 and 5,000 Å thick and formed of metal or a transparent conductive film.

A semiconductor layer 104 is disposed on source electrodes 103 and drain electrode 102 to contact and cover a portion of source electrodes 103 and drain electrode 102. Semiconductor layer 104 is formed of about a 2,000 Å or less thick silicon film, such as polycrystal silicon or amorphous silicon. The overlapping regions of these elements are covered with a gate insulating film 105 formed of an insulating substance such as SiO$_2$ or SiON (silicon oxide nitride). A gate electrode 106 formed of metal or a transparent conductive film is patterned on insulating film 105 and completely overlaps semiconductor layer 104 and also opposes portions of source electrodes 103 and drain electrode 102. Gate insulating film 105 also serves as a film for interlayer insulation.

Thin film transistor 100 is equivalent to a parallel circuit having two thin film transistors. Channel length L of thin film transistor 100 corresponds to a double arrow 109 and the space between source electrodes 103 is twice channel length L plus the width of drain electrode 102. Channel width W is twice the width indicated by an arrow 110.

The effects of pattern slippage on the parasitic capacitance of a thin film transistor constructed in accordance with the invention are illustrated generally in FIGS. 7A–7E and FIG. 8, the equivalent circuit thereof. A parasitic capacitance 601 and a parasitic capacitance 602 were generated due to overlap between a gate 506 and a source depicted by similarly cross-hatched sections S$_3$ and S$_5$, respectively. Likewise, a parasitic capacitance 603 was generated between gate 506 and a drain D, represented by cross-hatched section S$_4$.

When the pattern of gate electrode 506 was displaced in the direction of an arrow 511, areas S$_3$, S$_4$ and S$_5$ remained constant, indicating that parasitic capacitance 601, 602 and 603 were not affected by pattern slippage in that direction. When the pattern of gate electrode 506 was displaced in the direction of an arrow 512, the parasitic capacitances remained constant in the same way.

When the pattern was slipped in the direction of an arrow 513, the area of portion S$_4$ was not changed, but the areas of portion S$_3$ and S$_5$ were changed, represented by S$_6$ and S$_7$ respectively. However, even if parasitic capacitance 601 (S$_6$) was increased, parasitic capacitance 602 (S$_7$) decreased and the total of the parasitic capacitance at the source side was the same as with no pattern slippage (S$_6$+S$_7$=S$_3$+S$_5$) because parasitic capacitances 601 and 602 were electrically connected in parallel. Slippage in the direction of arrow 514 has the same result because areas $S_8+S_9=S_3+S_5$. The parasitic capacitance of the thin film transistor remained constant after pattern slippage occurred in any direction. Variation of parasitic capacitance in the same substrate or between different substrates can therefore be eliminated by including TFT's formed in accordance with the invention.

Figure 9:
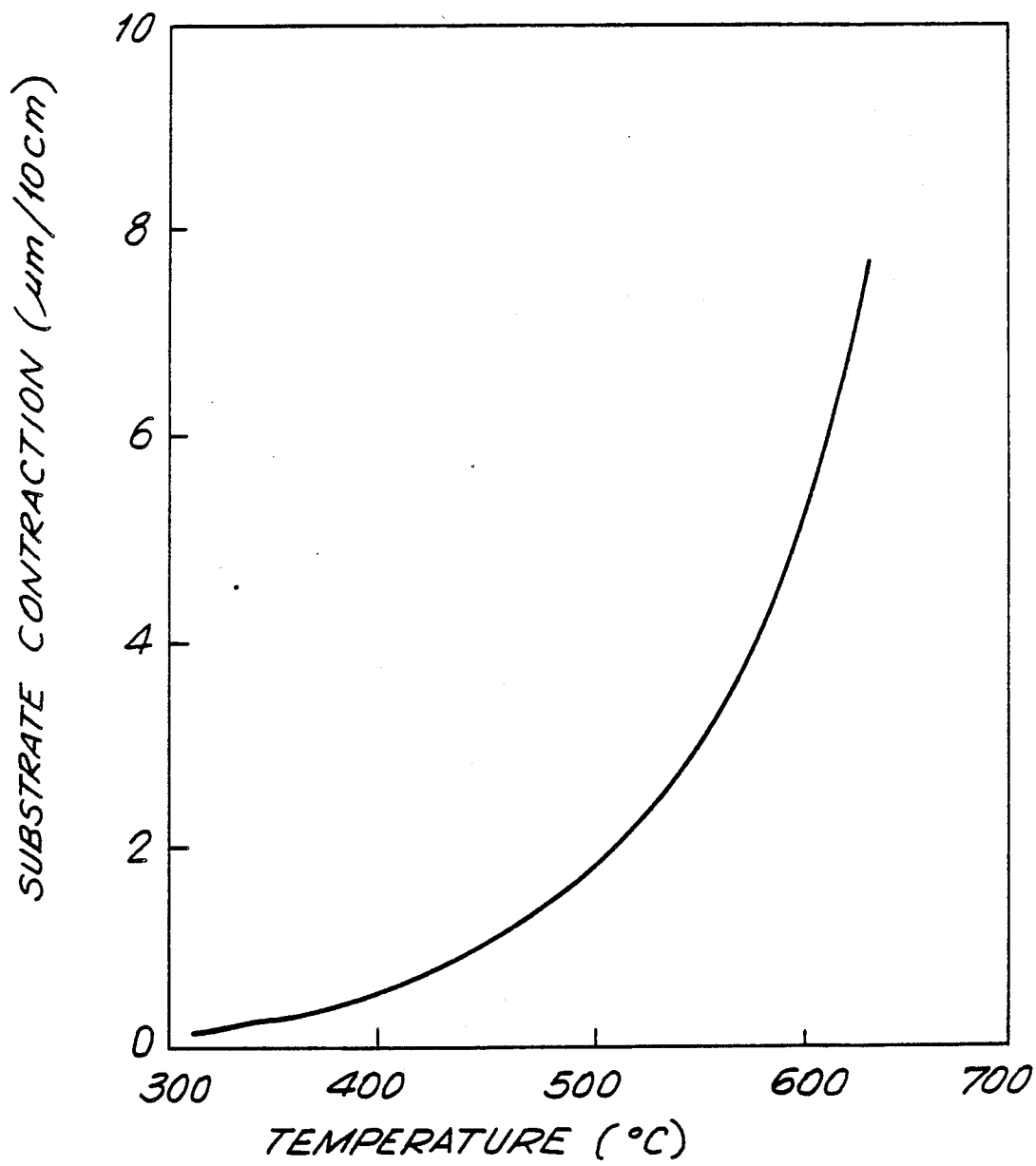
FIG. 9 is a graph showing the substrate contraction due to heat treatment temperature.

Pattern slippage can occur due to the effects of heat on the dimensions of the TFT substrate. A glass substrate is generally used as the insulating substrate for thin film transistors. When a glass substrate is heat treated and then cooled to room temperature, the external dimensions typically become smaller than they were before the heat treatment. This phenomenon is referred to as substrate contraction. FIG. 9 is a graph showing the contraction of a substrate #7059, (made by Corning Glass Works). The abscissa indicates the temperature of heat treatment and the ordinate indicates the amount of contraction per 10 cm of substrate after heat treatment. As shown in FIG. 9, a significant contraction of the substrate results from heat treatment at a temperature of 500° C. or higher.

When a semiconductor layer 504 formed of a material such as polycrystal silicon is deposited at a relatively high temperature of 500° C. or higher, contraction of the substrate after formation of the semiconductor layer results. This causes pattern slippage of semiconductor layer 504 and gate electrode 506 with respect to source electrode 503 and drain electrode 502 to become larger.

EXAMPLE 2

Figure 10:
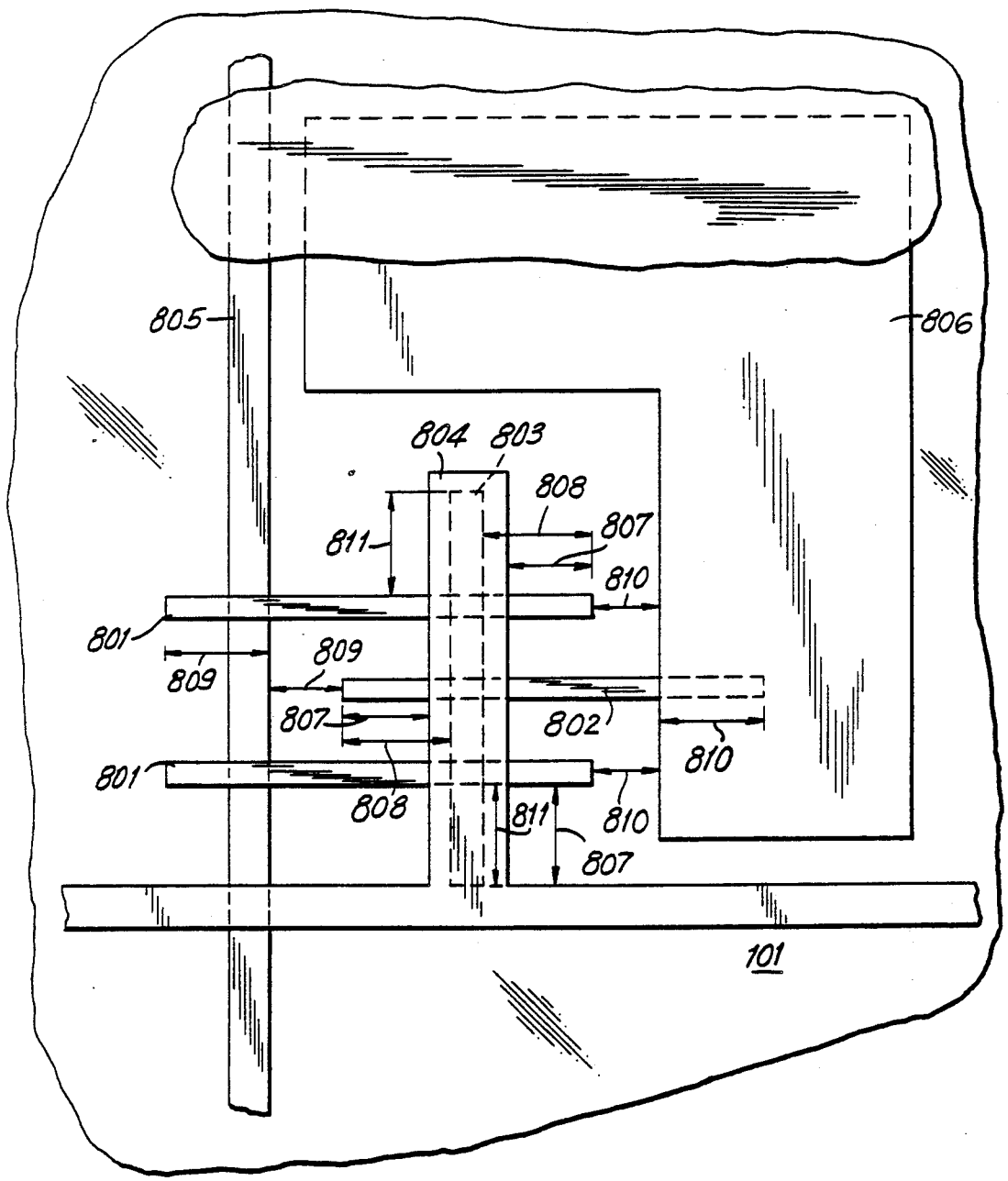
FIG. 10 is a top plan view of a picture element of an active matrix including a thin film transistor formed in accordance with the invention.

A source electrodes 801 and a drain electrode 802 were patterned on substrate 101 as shown in FIG. 10. Contraction or substrate 101 resulted from forming a semiconductor layer 803. The pattern slippage of semiconductor layer 803, a gate electrode 804, a source line 805 and a drain line 806 caused by contraction of substrate 101 was evaluated.

Pattern slippage due to alignment inaccuracy and pitch slippage of a photo mask is referred to as $d_1$ and that due to substrate contraction as $d_2$. Allowable dimensions of pattern slippage of semiconductor layer 803 with respect to source electrode 801 and drain electrode 802, represented by a double arrow 808, was determined to be $2d_1+d_2$ or larger. Further, allowable dimensions of pattern slippage of gate electrode 804, source line 805, drain line 806 and semiconductor 803, respectively with respect to source electrode 801 and drain electrode 802, represented by a set of double arrows 807, 809, 810 and 811, respectively, was determined to be $d_1+d_2$ or higher.

Variation of the parasitic capacitance does not occur when pattern slippage occurs in any direction within these dimensions. This is especially important when semiconductor layer 803 is formed of a material such as polycrystal silicon or the like at a temperature of 500° C. or higher.

EXAMPLE 3

Figure 11:
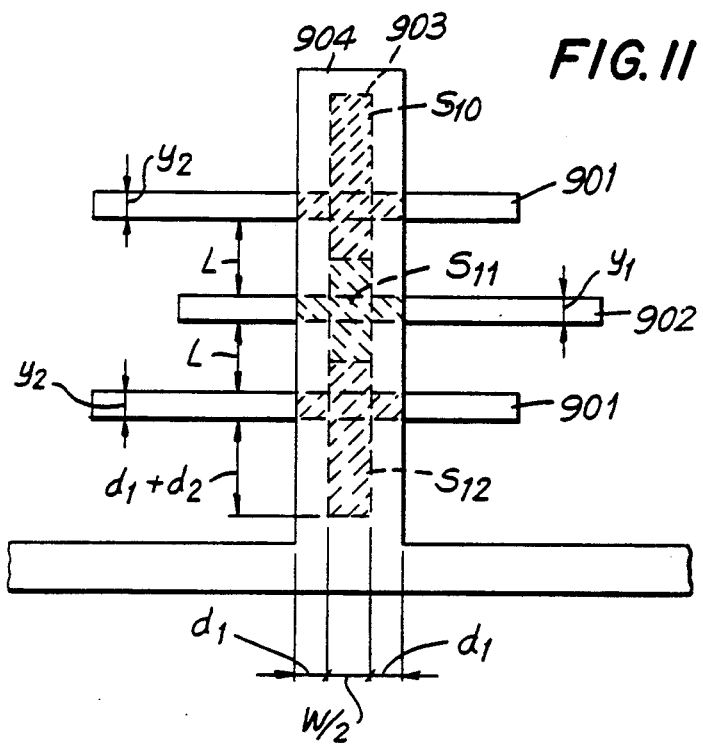
FIG. 11 is a top plan view of a thin film transistor formed in accordance with the invention.
Figure 12:
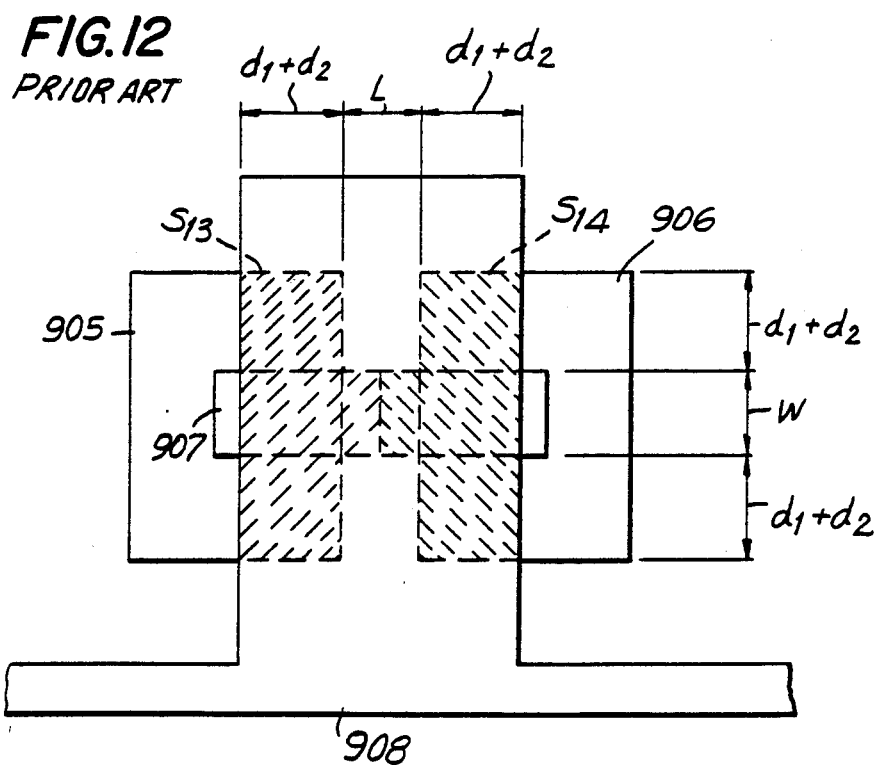
FIG. 12 is a top plan view of a conventional thin film transistor.

Differences between the parasitic capacitance of a thin film transistor constructed in accordance with the invention and a conventional TFT are shown in FIGS. 11 and 12. Similarly cross-hatched sections $S_{10}$ and $S_{12}$ indicate areas of parasitic capacitance between a gate electrode 904 and a source electrode 901 with a dielectric gate insulating film therebetween. The value of areas $S_{10}+S_{12}$ remain constant even when pattern slippage occurs in any direction. The area can be computed as the following equality:

$$S_{10}+S_{12}=2[Y_2(2d_1+W/2)+W/2\times L/2+W/2(d_1+d_2)](\mu m^2) \tag{1}$$

$Y_2$ ... Width of source electrode 901 ($\mu$m)
L ... channel length of a thin film transistor ($\mu$m)
W ... channel width of a thin film transistor ($\mu$m)

A cross-hatched section $S_{11}$ represents parasitic capacitance between gate electrode 904 and a drain electrode 902, and this area can be computed as the following equality:

$$S_{11}=Y_1(2d_1+W/2)+2\times W/2\times L/2 \ (\mu m) \tag{2}$$

$Y_1$ ... width of drain electrode 902 ($\mu$m)

Cross-hatched portion $S_{13}$ indicates the parasitic capacitance between a gate electrode 908 and a source electrode 905 and cross-hatched section $S_{14}$ indicates the parasitic capacitance between a drain electrode 906 and gate electrode 908 in a conventional TFT. If there is no pattern slippage, the area of $S_{13}$ equals the area of $S_{14}$ and is shown by the following equality:

$$S_{13}=S_{14}=[2(d_1+d_2)+W](d_1+d_2)+LW/2 \ (\mu m) \tag{3}$$

If the gate insulating films are made of the same materials and have the same thickness, parasitic capacitance is determined by areas $S_{10}$ through $S_{14}$.

Generally, pattern slippage $d_1$ due to alignment inaccuracy or pitch slippage in the photo mask can be approximately 3 $\mu$m. At 600° C., a typical temperature for forming polycrystal silicon, substrate contraction $d_2$ is approximately 6 $\mu$m per 10 cm of the length of the substrate as shown in FIG. 9.

Accordingly, if $d_1=3$ and $d_2=0.6X$ (X is the length of the substrate in the longitudinal direction (cm)) are substituted for equalities (1), (2) and (3), the equalities are as follows:

$$S_{10}+S_{12}=2[Y_2(6+W/2)+LW/4+W/2(3+0.6X)] \ (\mu m^2) \tag{4}$$

$$S_{11}=Y_1(6+W/2)+LW/2 \ (\mu m^2) \tag{5}$$

$$S_{13}=S_{14}=2[(3+0.6X)+W](3+0.6X)+LW/2 \ (\mu m^2) \tag{6}$$

In order to reduce the parasitic capacitance formed between the source electrode and the gate electrode compared to a conventional thin film transistor, the expression:

$$S_{10}+S_{12}<S_{13} \tag{7}$$

must be satisfied.

The following expression is obtained by substituting equalities (4) and (6) for expression (7).

$$Y_2<2(3+0.6X)^2/(12+W) \ (\mu m^2) \tag{8}$$

Accordingly, it is possible to reduce the parasitic capacitance formed between the source electrode and the gate electrode in comparison with a conventional thin film transistor, when width $Y_2$ of the source electrode satisfies expression (8).

EXAMPLE 4

Figure 13:
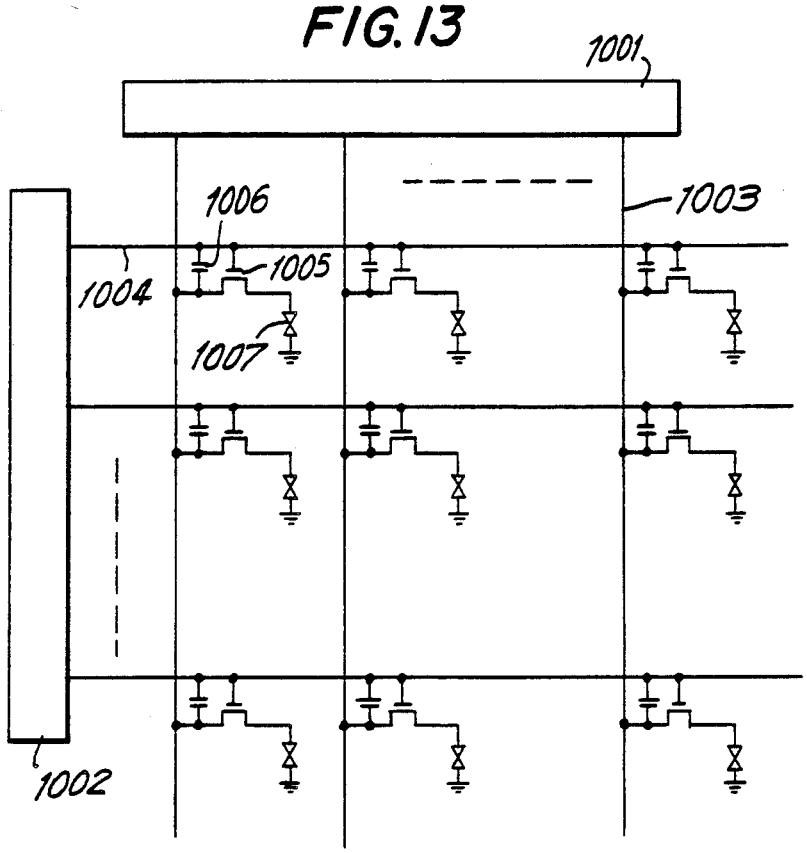
FIG. 13 is an equivalent circuit of a liquid crystal display device including thin film transistors.
Figure 19:
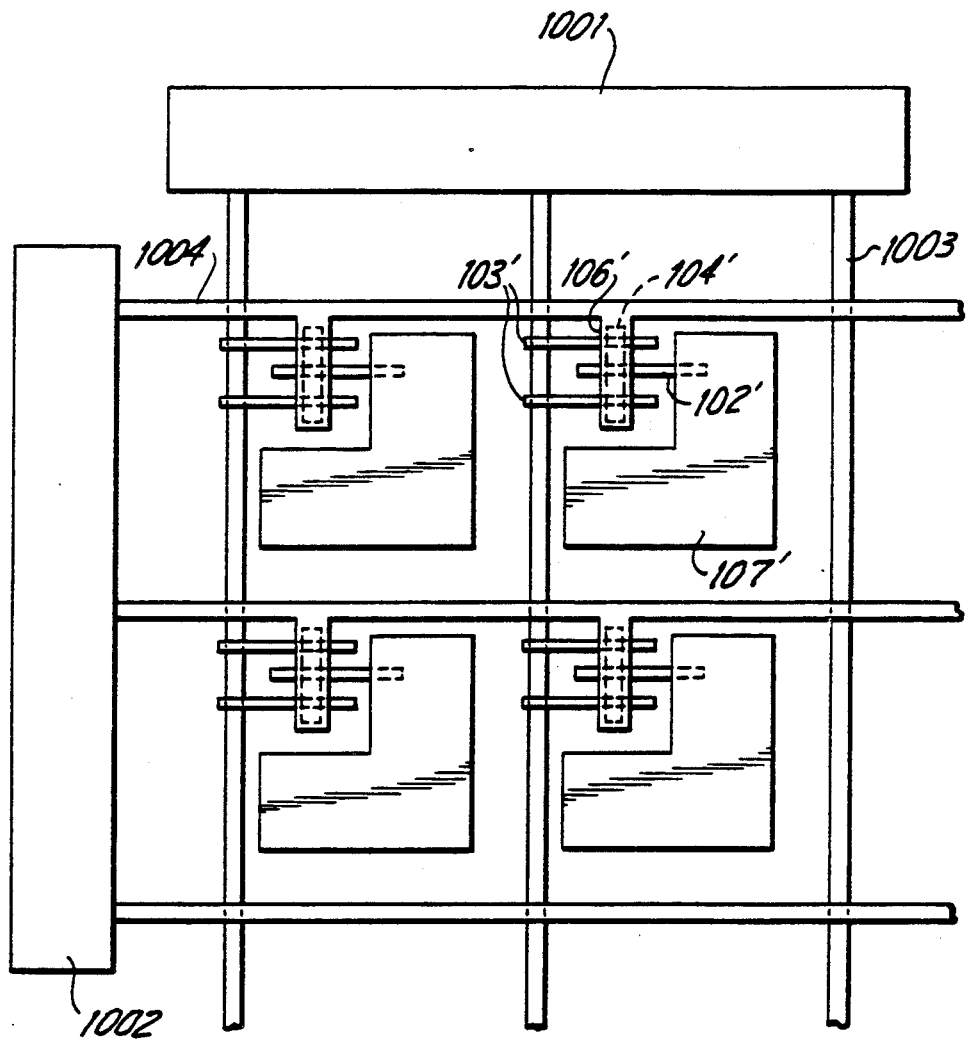
FIG. 19 is a matrix of thin film transistors in accordance with the invention.

An equivalent circuit for an active matrix liquid crystal display device including TFT's formed in accordance with the invention is shown in FIGS. 13 and 19. The device includes a plurality of parallel source lines 1003 and orthogonal gate lines 1004 with a TFT 1005 at each intersection coupled to a picture element 1007. Source lines 1003 are coupled to a hold circuit 1001 and gate lines 1004 are coupled to a scanning circuit 1002. A parasitic capacitance 1006 is present at each gate line 1004 intersection with source line 1003. However, because parasitic capacitance of capacitor 1006 can be smaller than in a conventional TFT, the power to drive hold circuit 1001 can be reduced to make a small-sized and inexpensive large scale integration (LSI) possible. Further, if hold circuit 1001 is formed to operate with conventional driving power, a liquid crystal display with a greater number of gate lines 1004 can be driven.

Each TFT of FIG. 13 can have a structure similar to that shown in FIG. 1, as shown in FIG. 19. As described in Example 1, each TFT of the matrix can include a gate electrode 106' coupled to gate line 1004 and a pair of source electrodes 103' coupled to source line 1003. A drain line 107' in the form of an electrode for driving a liquid crystal picture element is also provided and is coupled to a drain electrode 102'. Source electrodes 103' are parallel and drain electrode 102' is parallel to and between source electrodes 103'. A channel region 104' overlapped by a gate electrode 106' crosses source electrodes 103' and drain electrode 102'.

To reduce the parasitic capacitance between the drain electrode and the gate electrode in comparison with a conventional thin film transistor, the following expression:

$$S_{11} < S_{14} \quad (9)$$

must be satisfied. The following expression is obtained by substituting equalities (5) and (6) for expression (9).

$$Y_1 < (6+1.2+W)(3+0.6X)/(6+W/2) \; (\mu m) \quad (10)$$

The parasitic capacitance between the drain electrode and the gate electrode can be reduced to a lower value than in a conventional thin film transistor when width $Y_1$ of the drain electrode satisfies expression (10).

EXAMPLE 5

Figure 14A:
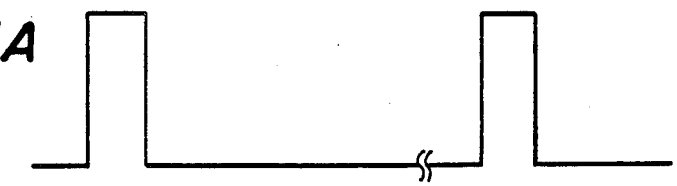
FIG. 14A, 14B and 14C are driving waveforms of a liquid crystal display device including thin film transistors formed in accordance with the invention.
Figure 14B:
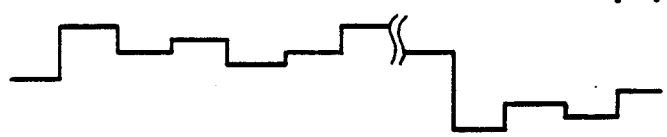
Figure 14C:
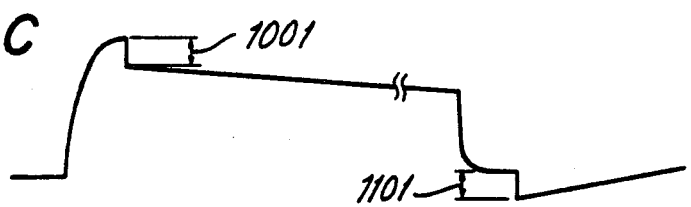

FIGS. 14A, 14B and 14C illustrate a general driving waveform of a liquid crystal display device which includes thin film transistors. FIG. 14A is a gate signal applied to the gate line to excite the thin film transistor to the ON condition by time sharing at each line. The data signal illustrated in FIG. 14B is applied to the source line, synchronous with the gate signal and is transmitted to the liquid crystal layer through the thin film transistor. When the gate signal is shifted to the gate electrode of the next line, the thin film transistor is switched to the OFF condition, insulating the source line from the liquid crystal layer. Therefore, the data signal stored in the liquid crystal layer is held until the receipt of the next scanning signal.

The voltage across the liquid crystal layer is illustrated in FIG. 14C. Change voltage (▲ V) 1101 occurs when the thin film transistor is changed from the ON condition to the OFF condition upon removal of gate signal to the TFT. Change in voltage ▲ V is determined by the ratio of parasitic capacitance ($C_p$) to liquid crystal layer capacitance ($C_{lc}$) formed between the drain electrode and the gate electrode of the thin film transistor and is expressed as follows:

$$\blacktriangle \; V \propto \frac{C_p}{C_p + C_{lc}}$$

Consequently, if parasitic capacitance $C_p$ of a TFT formed in accordance with the invention can be less than that of a conventional thin film transistor, ▲ V can be reduced. This improves the holding characteristic and achieves a higher contrast ratio without flicker to provide a high quality picture. Further, as variations in parasitic capacitance from pattern slippage are reduced, a large-sized liquid crystal display of high picture quality can be achieved. When a thin film transistor formed in accordance with the invention is included in an image sensor and a three dimensional integrated circuit, the circuit constant can be brought to near the desired value to achieve high performance.

EXAMPLE 6

Figure 15:
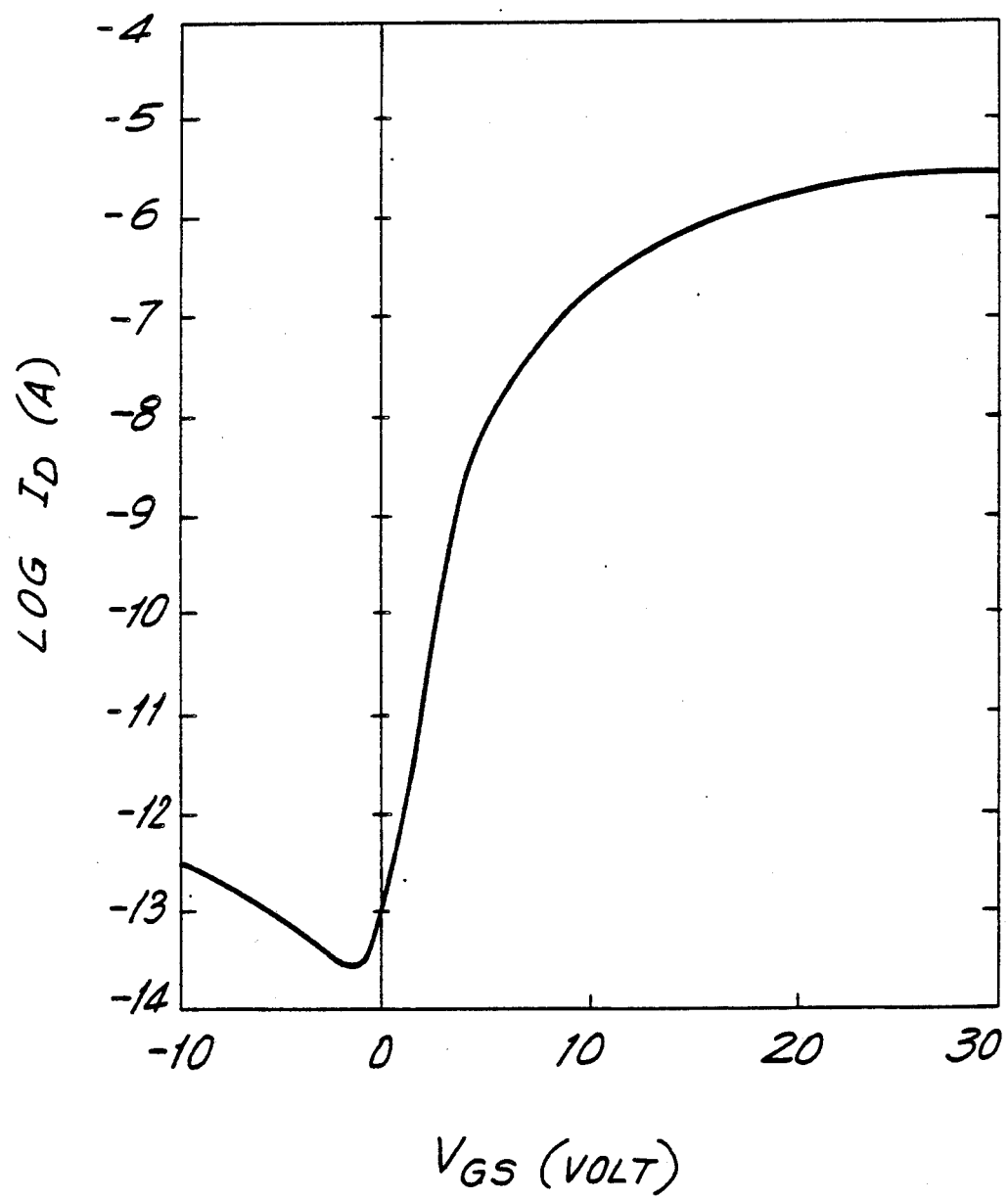
FIG. 15 is a graph showing voltage-current characteristics of a thin film transistor formed in accordance with the invention.

The electrical characteristics of a thin film transistor constructed in accordance with the invention are shown in FIG. 15. The abscissa shows gate voltage $V_{GS}$ and the ordinate shows the log of drain current $I_D$. To obtain this data, the drain voltage $V_D$, the channel length and the channel width were 4 V, 20 μm and 10 μm, respectively. The semiconductor layer was a 200 Å thick polycrystal silicon layer. As shown in FIG. 15 a small OFF current and a large ON current exist to show that a thin film transistor in accordance with the invention has substantially the same voltage-current characteristics as a conventional TFT.

EXAMPLE 7

Figure 16:
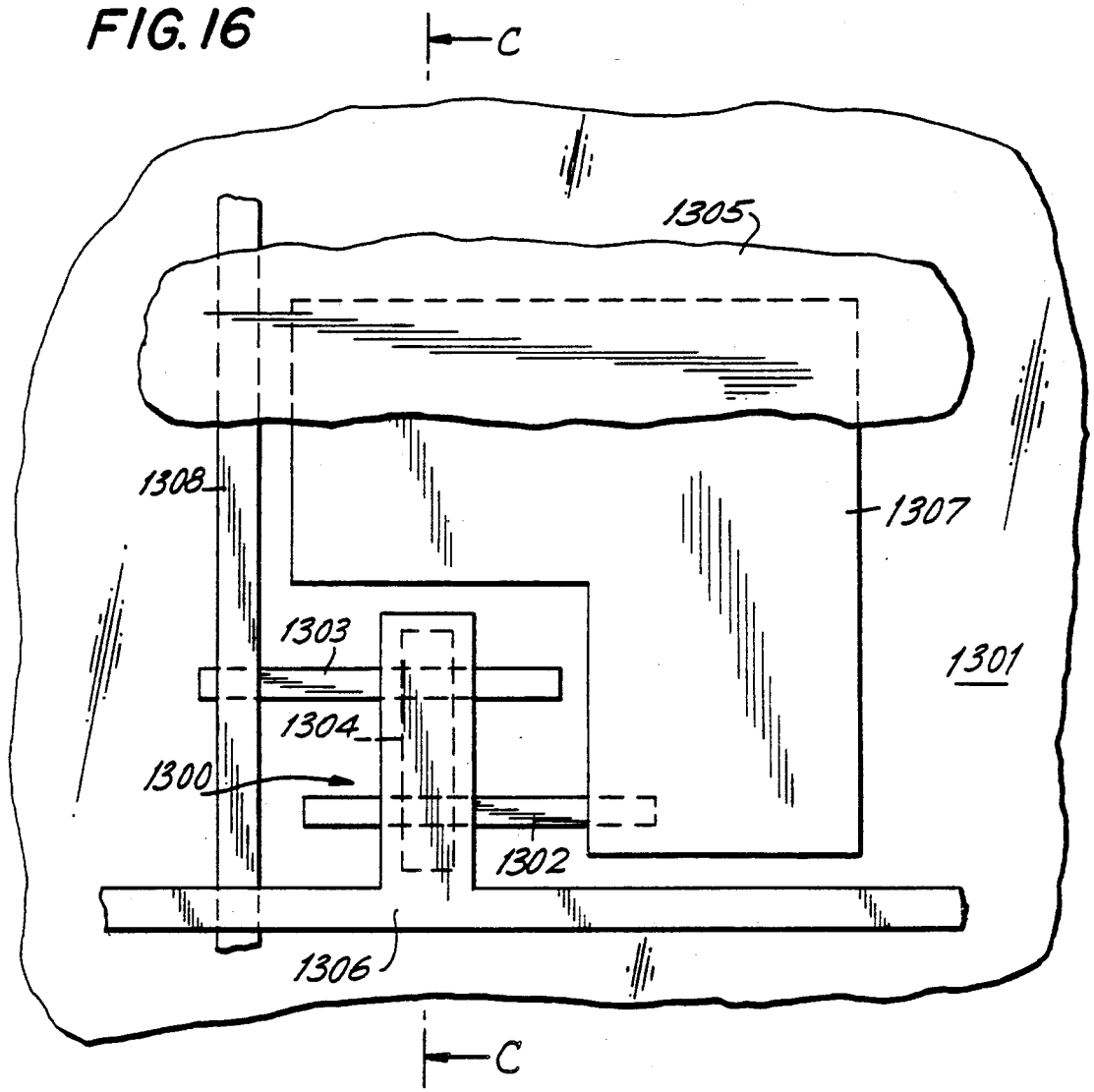
FIG. 16 is a top plan view of a picture element of an active matrix including a thin film transistor formed in accordance with the invention.
Figure 17:
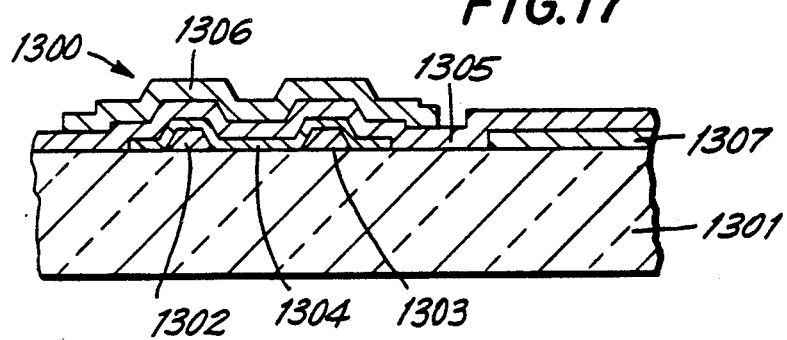
FIG. 17 is a cross-sectional view taken along line C—C of the thin film transistor shown in FIG. 16.

A thin film transistor 1300 formed in accordance with another embodiment of the invention including one source electrode and one drain is shown in FIGS. 16 and 17. A source electrode 1303 and a drain electrode 1302, each formed of a thin film of silicon such as polycrystal silicon or amorphus silicon having donor or acceptor impurities added, are deposited, parallel with each other, on an insulating substrate 1301. A semiconductor layer 1304 of a thin film of silicon, such as a polycrystal silicon or an amorphous silicon, is disposed on substrate 1301 and on an upper side of source electrode 1303 and drain electrode 1302.

Channel length L of thin film transistor 1300 should be similar to the first embodiment and the thickness of the film should be between about 500 and 5000 Å. The thickness of semiconductor layer 1304 should be about 2000 Å or less. A source line 1308 formed of a metal or a transparent conductive film or the like is electrically coupled with source electrode 1303. A picture element electrode 1307 is electrically coupled with drain electrode 1302. A portion of source electrode 1303 and drain electrode 1302 are covered With semiconductor layer 1304 and a gate insulating film 1305, formed from $SiO_2$, $SiN_2$, SiON or the like. A gate electrode 1306 is patterned on gate insulating film 1305 to overlap semiconductor layer 1304 entirely. Gate electrode 1306 is a metal or a transparent conductive film or the like. Gate insulating film 1305 can also serve as an interlayer insulating film for insulating between crossing gate lines 1306 and source line 1308.

Figure 18A:
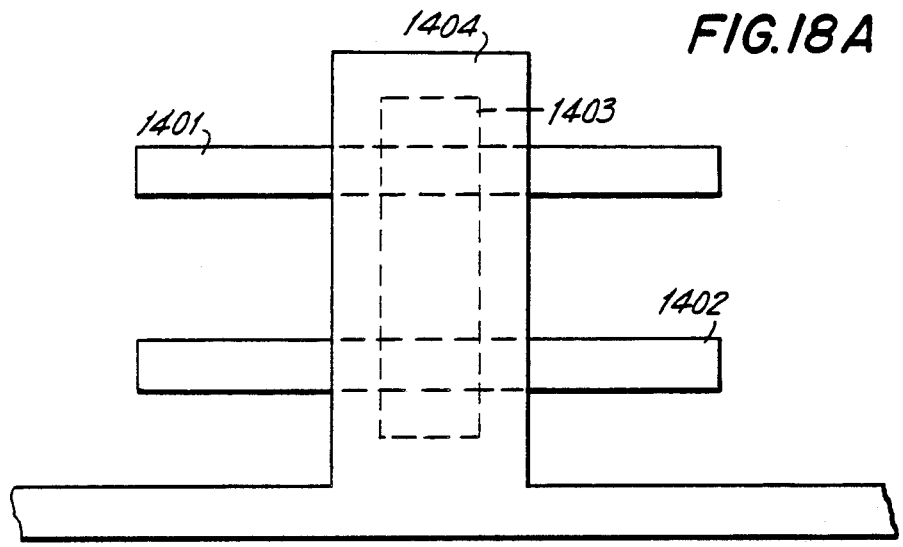
FIGS. 18A, 18B and 18C are top plan views of the type of thin film transistor shown in FIG. 16.
Figure 18B:
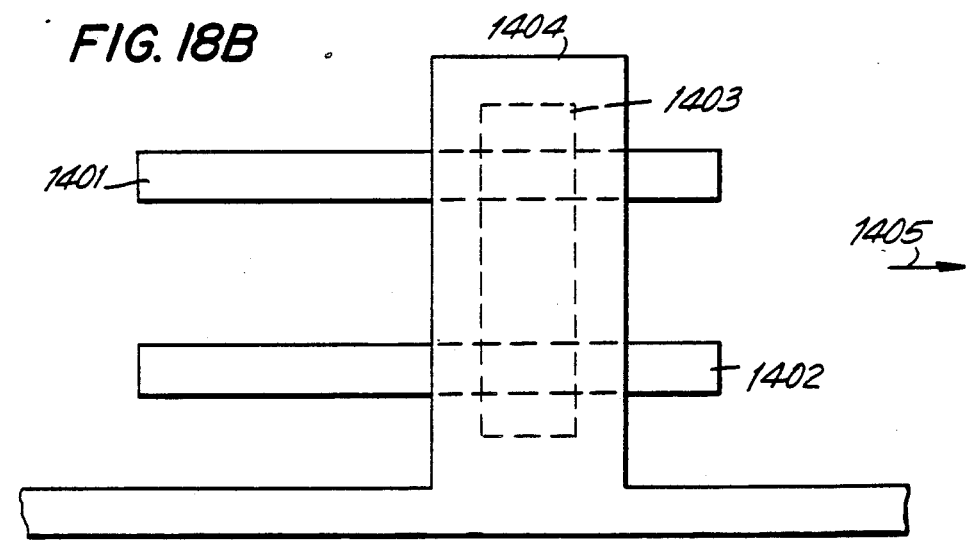
Figure 18C:
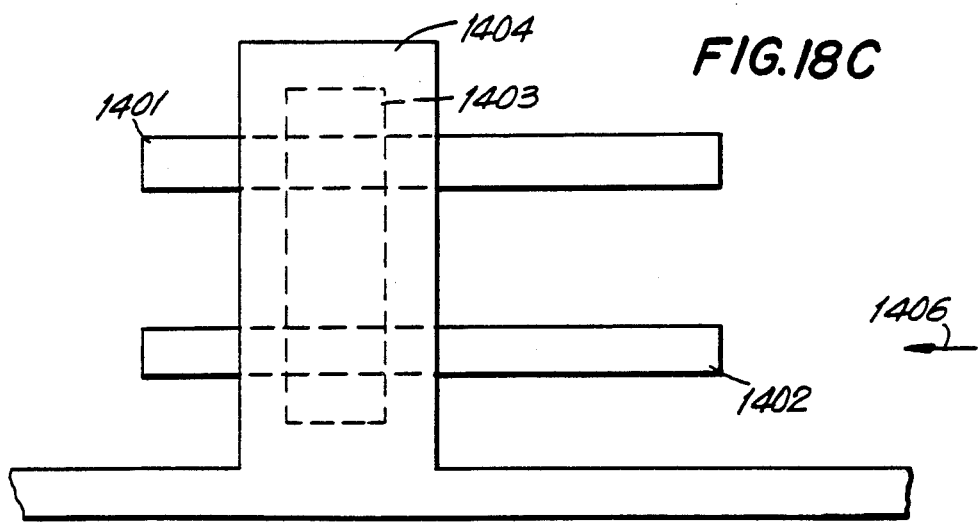

The effects of pattern slippage in a TFT similar to thin film transistor 1300 are shown in FIGS. 18A, 18B and 18C. If pattern slippage of a gate electrode 1404 occurs in the direction of an arrow 1405, the area of portions of gate electrode 1404 which overlap a source electrode 1401 and a drain electrode 1402 remains constant. If the pattern of gate electrode 1404 slips in the opposite direction shown by an arrow 1406, the result is the same. Consequently, the parasitic capacitance of the thin film transistor remains constant despite limited pattern slippage in any direction.

The embodiment of Example 7 is referred to as a thin film transistor with a staggered element structure. It is apparent that a thin film transistor with an inverted-staggered element structure produces the same effect. Furthermore, a thin film transistor with three or more source electrodes produces the same effect.

TFT's constructed in accordance with the invention have the following beneficial effects:

(1) The parasitic capacitance of the thin film transistor can be kept constant and is not affected by a pattern slippage. This results in constant capacitance for a single source line. This greatly aids in the construction of a large size liquid crystal displays having uniform display quality and high picture quality, without varying the delay time of a signal along each source line.

(2) The parasitic capacitance between the source electrode and the gate electrode of the thin film transistor can be reduced, compared to a conventional thin film transistor. Therefore, when the transistor is included in a liquid crystal display device, the driving circuit load can be reduced so that inexpensive integrated circuit drivers with small-sized chips can be used. If an IC drive of the same driving capacity as for a conventional TFT is used, it can drive a liquid crystal display device with more scanning lines.

(3) The parasitic capacitance formed between the drain electrode and the gate electrode is kept constant, and is not affected by a pattern slippage and can be smaller than conventional parasitic capacitance. Hence, the holding characteristic of the signal voltage in the liquid crystal layer can be improved and high quality pictures with a high contrast ratio and no flicker can be achieved.

(4) It becomes easier to design a circuit on an active matrix substrate and a hold circuit due to a circuit constant which is kept at a certain level.

(5) The tolerance for a pattern slippage can be set at a comparatively large value, so that the strict process control required for forming a conventional thin film transistor is unnecessary. This improves production yield.

(6) Because the parasitic capacitance remains constant regardless of pattern slippage, variations of a substrate or between more than one substrate can be eliminated, to improve the quality. As a result, a thin film transistor can be formed on a large substrate.

(7) The ON-OFF characteristics of the transistor are the same as a conventional TFT so that a small OFF current and large ON current can be maintained.

(8) If a semiconductor, such as polycrystalline silicon which is formed at a comparatively high temperature of 500° C. and higher is used for the semiconductor layer, the parasitic capacitance can be kept constant and is not affected by pattern slippage from substrate contraction which keeps a circuit constant at a predetermined level.

As described above, the thin film transistor constructed in accordance with the invention has various excellent properties and benefits that can be applied to various fields, such as for an active matrix substrate for a display device and the peripheral circuits thereof, an image sensor, a three dimensional integrated circuit or the like.

It will thus be seen that the objects set forth above among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A thin film transistor on an insulating substrate, comprising:
    at least one source electrode and at least one drain electrode disposed on the substrate as parallel alternating source electrode and drain electrode strips;
    an island-like channel region of a semiconductor material disposed on the substrate and across a portion of the source electrode and the drain electrode;
    an insulating layer disposed over the channel region; and
    a gate electrode disposed on the insulating layer and completely overlapping the channel region, the gate electrode crossing the source electrode and the drain electrode, and portions of each source electrode and drain electrode are not overlapped by the gate electrode and extend to opposite sides of the gate electrode.

2. The thin film transistor of claim 1, wherein the source electrode, drain electrode and channel region are elongated.

3. The thin film transistor of claim 2, including at least two source electrodes in parallel and one fewer drain electrode in an alternating pattern with a drain electrode between two source electrodes.

4. The thin film transistor of claim 3, wherein the channel length L is the total distance between one source electrode and the drain electrode, channel width W is the distance across the channel region and channel length L is about two times larger than channel width W.

5. The thin film transistor of claim 2, wherein there are an odd number of alternating source electrodes and drain electrodes.

6. The thin film transistor of claim 1, wherein the source electrodes and drain electrodes are formed of polycrystalline silicon or amorphous silicon which has been doped.

7. The thin film transistor of claim 1, wherein the semiconductor channel region is formed of polycrystalline silicon or amorphous silicon.

8. The thin film transistor of claim 1, wherein the substrate is transparent.

9. The thin film transistor of claim 1, wherein the substrate is formed of one of glass, quartz and sapphire.

10. The thin film transistor of claim 2, wherein the width of the source electrodes and the drain electrodes are about 20 μm or less.

11. The thin film transistor of claim 2, wherein the thickness of the source electrodes and drain electrodes is between about 500 and 5000 Å.

12. The thin film transistor of claim 2, wherein the thickness of the semiconductor channel region is less than about 2000 Å.

13. The thin film transistor of claim 10, including two source electrodes and one drain electrode disposed therebetween.

14. A thin film transistor formed on an insulating substrate, comprising:
   n elongated source electrodes arranged in parallel on the substrate;
   n−1 elongated drain electrodes disposed on the substrate substantially parallel to the source electrodes with the drain electrodes positioned between source electrodes;
   an island-like channel region of a semiconductor material disposed on the substrate and lying substantially orthogonal across the elongated source electrodes and drain electrodes;
   a gate insulating film disposed on the channel region of semiconductor material; and
   a gate electrode disposed on the gate insulating film and completely overlapping the semiconductor material, the gate electrode crossing a portion of at least the source electrodes and drain electrodes, with portions of each source electrode and drain electrode that are not under the gate electrode extending to different sides of the gate electrode.

15. The thin film transistor of claim 14, wherein the elongated source electrodes, drain electrodes channel region and gate electrode are substantially rectangular in shape.

16. An active matrix substrate for an electro-optical device, comprising:
   an insulating substrate;
   a plurality of spaced apart parallel source lines on the substrate;
   a plurality of spaced apart parallel gate lines on the substrate the gate lines orthogonal to and crossing the source lines at intersections of source lines and gate lines and an insulating layer between the source and gate lines at the intersections;
   a plurality of electro-optical driving electrodes on the substrate and arranged in columns and rows at the intersection of each source line and gate line;
   at least one elongated source electrode disposed on the substrate at each intersection and electrically coupled to the source line at the intersection;
   at least one elongated drain electrode disposed on the substrate at each intersection substantially parallel to and spaced apart from the source electrode and electrically coupled to the driving electrode at the intersection;
   an individual island-like channel region of a semiconductor material disposed substantially orthogonal across each source electrode and drain electrode at each intersection;
   a gate insulating film disposed on each channel region; and
   a gate electrode disposed on and completely overlapping the channel region lying substantially orthogonal across and over portions of the source and drain electrodes at each intersection, and portions of each source and drain electrode are not under the gate electrode and extend to both sides of the gate electrode, each gate electrode electrically connected to the gate line at the intersection to form a thin film transistor at each intersection connected to the driving electrode at the intersection.

17. The active matrix substrate of claim 16, wherein there are n source electrodes and n−1 drain electrodes in an alternating pattern with each drain electrode between two source electrodes.

18. The active matrix substrate of claim 16, wherein the gate insulating film is the insulating layer between crossing source and gate lines.

19. The active matrix substrate of claim 16, wherein the substrate is transparent.

20. The thin film transistor of claim 19, wherein the substrate is formed of glass, quartz or sapphire.

21. The thin film transistor of claim 16, wherein the source electrodes and drain electrodes are formed of doped polycrystalline silicon or doped amorphous silicon.

22. The thin film transistor of claim 16, wherein the channel region is formed of polycrystalline silicon or amorphous silicon.

23. An electro-optical display device, comprising an active matrix substrate including a plurality of electro-optical driving electrodes arranged in a matrix of columns and rows, each driving electrode coupled to a thin film transistor including at least one elongated source electrode and at least one elongated drain electrode disposed on the substrate as an odd number of alternating substantially parallel source electrode and drain electrode strips, an individual island-like elongated channel region of a semiconductor material disposed on the substrate and substantially orthogonal across a portion of the source electrode and the drain electrode for each thin film transistor of the matrix, an insulating layer disposed over the channel region, and a gate electrode extending from a gate line disposed on the insulating layer the gate electrode completely overlapping the channel region across and over a portion of the source electrode and the drain electrode and portions of each source and drain electrodes that are not under the gate electrode extend to both sides of the gate electrode.

24. The electro-optical display device of claim 23, including an opposed common electrode substrate having common electrodes for cooperating with the driving electrodes to provide a display with a liquid crystal material between the substrates.

25. A thin film transistor on an insulating substrate, comprising:
   at least one source electrode and at least one drain electrode disposed on the substrate as strips;
   an island-like channel region of a semiconductor material disposed on the substrate and across a portion of the source electrode and the drain electrode;
   an insulating layer disposed over the channel region;
   a gate electrode disposed on the insulating layer and completely overlapping the channel region across the source electrode and the drain electrode so that a parasitic capacitance will develop between the gate electrode and the overlapped source electrode, drain electrode and channel region;
   the source electrode and drain electrode and the gate electrode and channel element patterned so that displacement of the gate electrode in a direction parallel with the source electrode and drain electrode does not affect the value of the parasitic capacitance when current is applied to the gate electrode.

26. The thin film transistor of claim 25, including at least two source electrodes in parallel and one fewer drain electrode in an alternating pattern with a drain electrode between two source electrodes patterned so that displacement of the gate electrode and channel region in any direction will not affect the parasitic capacitance.

27. The thin film transistor of claim 25, wherein displacement of the gate electrode in a direction parallel with or orthogonal to the source electrode and drain electrode does not affect the parasitic capacitance.

28. A thin film transistor on an insulating substrate, comprising:
  at least one source electrode and at least one drain electrode disposed on the substrate as substantially parallel strips;
  an island-like channel region strip disposed over and across the source electrode and drain electrode;
  an insulating film disposed over the source and drain electrodes and over the channel region;
  a gate electrode strip disposed on the insulating film and completely overlapping the channel region, substantially orthogonal to and over portions of the source and drain electrode and the portions of each source and drain electrode not under the gate electrode extend to both sides of the gate electrode.

29. The thin film transistor of claim 28, wherein there are an odd numbers of alternating source and drain electrodes.

30. The active matrix substrate of claim 16, wherein there are an odd number of alternating source electrodes and drain electrodes at each intersection.

31. An active matrix substrate for an electro-optical device, comprising:
  an insulating substrate;
  a plurality of spaced apart parallel source lines on the substrate;
  a plurality of spaced apart parallel gate lines on the substrate the gate lines orthogonal to and crossing the source lines at intersections of source lines and gate lines and an insulating layer between the source and gate lines at the intersections;
  a plurality of electro-optical driving electrodes on the substrate at the intersection of each source line and gate line;
  at least one elongated source electrode strip at each intersection extending from the source lines at each intersection and electrically coupled to the source line at the intersection;
  at least one elongated drain electrode at each intersection substantially parallel to and spaced apart from the source electrode and electrically coupled to the driving electrode at the intersection;
  an individual island-like channel region of a semiconductor material disposed across each source electrode and drain electrode at each intersection;
  a gate insulating film disposed on each channel region; and
  a gate electrode extending from the gate line disposed over and completely overlapping the channel region across and over portions of the source and drain electrodes at each intersection, with portions of each source and drain electrode not under the gate electrode and extending to both sides of the gate electrode.

32. The active matrix substrate of claim 31, wherein the source electrode extends substantially orthogonal to the source line to which it is coupled and the gate electrode extends substantially orthogonal from the gate line and the channel region extends substantially parallel to the source line and substantially orthogonal to the gate line.

* * * * *